United States Patent
Strobel

(10) Patent No.: US 12,055,608 B2
(45) Date of Patent: Aug. 6, 2024

(54) AUTONOMOUS COOLING OF A SUPERCONDUCTIVE DRY-COOLED MR MAGNETIC COIL SYSTEM

(71) Applicant: Bruker BioSpin GmbH, Ettlingen (DE)

(72) Inventor: Marco Strobel, Karlsruhe (DE)

(*) Notice: Subject to any disclaimer, the term of this patent is extended or adjusted under 35 U.S.C. 154(b) by 316 days.

(21) Appl. No.: 17/830,669

(22) Filed: Jun. 2, 2022

(65) Prior Publication Data

US 2022/0404445 A1 Dec. 22, 2022

(30) Foreign Application Priority Data

Jun. 22, 2021 (DE) .......................... 102021206392.6

(51) Int. Cl.
*G01R 33/38* (2006.01)
*G01R 33/3815* (2006.01)

(52) U.S. Cl.
CPC ..... *G01R 33/3804* (2013.01); *G01R 33/3815* (2013.01)

(58) Field of Classification Search
CPC .... G01R 33/3804; G01R 33/3815; H01F 6/04
See application file for complete search history.

(56) References Cited

U.S. PATENT DOCUMENTS 7,301,343 B1 * 11/2007 Sellers ............... G01R 33/3856
324/318
7,372,274 B2   5/2008 Ardenkjaer-Larsen et al.
(Continued)

FOREIGN PATENT DOCUMENTS

DE         60122361 T2     6/2007
DE       202017001501 U1   5/2017
JP         2020145371 A     9/2020

*Primary Examiner* — Filip Zec
(74) *Attorney, Agent, or Firm* — Benoît & Côté Inc.

(57) ABSTRACT

A method for autonomously cooling down a cryogen-free superconductive magnetic coil system includes:
(a1) measuring the current temperature $T_{actual}$ at the magnet and comparing it to a temperature target value $T1_{target}$;
(a2) if $T_{actual} > T1_{target}$, actuating a vacuum pump and opening a barrier valve in a vacuum conduit that leads from the vacuum pump into a vacuum vessel containing the magnet;
(b1) measuring the current pressure $P_{actual}$ in the vacuum vessel and comparing it to a pressure target value $P1_{target}$;
(b2) if $P_{actual} < P1_{target}$, activating a cold head for cooling a cooling arm;
(c1) measuring $T_{actual}$ and comparing it to the first temperature target value $T1_{target}$;
(c2) if $T_{actual} < T1_{target}$, closing the barrier valve and switching off the vacuum pump;
(d1) measuring $T_{actual}$ and comparing it to a second temperature target value $T2_{target}$ and maintaining the second temperature target value $T2_{target}$.

11 Claims, 8 Drawing Sheets

(56) References Cited

U.S. PATENT DOCUMENTS

| | | | |
|---|---|---|---|
| 7,868,617 B2* | 1/2011 | Seeber | G01R 33/3815 |
| | | | 324/318 |
| 8,676,282 B2* | 3/2014 | Jiang | G01R 33/3815 |
| | | | 165/157 |
| 8,729,894 B2 | 5/2014 | Hollis | |
| 8,736,266 B2* | 5/2014 | Sakakura | G01R 33/3856 |
| | | | 324/318 |
| 9,574,685 B2* | 2/2017 | Mykleby | F16L 59/143 |
| 9,910,114 B2* | 3/2018 | Chen | F25B 25/005 |
| 10,101,420 B2 | 10/2018 | Wikus | |
| 10,203,067 B2 | 2/2019 | Strobel | |
| 10,203,068 B2 | 2/2019 | Strobel | |
| 10,823,791 B2 | 11/2020 | Biber | |
| 11,703,393 B2* | 7/2023 | McCormack | G01K 17/12 |
| | | | 374/112 |
| 2006/0225433 A1 | 10/2006 | Jammu | |
| 2016/0189841 A1* | 6/2016 | Li | H01F 6/04 |
| | | | 62/437 |
| 2019/0212049 A1 | 7/2019 | Strobel et al. | |

\* cited by examiner

AUTONOMOUS COOLING OF A SUPERCONDUCTIVE DRY-COOLED MR MAGNETIC COIL SYSTEM

BACKGROUND OF THE INVENTION

Field of the Invention

The invention relates to a method of operating a magnetic resonance ("MR") apparatus having a superconductive MR magnetic coil system which is disposed in a vacuum vessel and is dry in MR analysis operation (i.e., "cryogen-free") and having a cryostat for cooling the MR magnetic coil system which comprises a neck tube that leads through an outer shell of the vacuum vessel to the MR magnetic coil system, wherein a cooling arm of a cold head is disposed at least partly within the neck tube, wherein a closed cavity which is formed around the cooling arm is sealed in a fluid-tight manner with respect to the MR magnetic coil system to be cooled and is at least partly filled with a cryogenic fluid in the normal operation of the MR apparatus. Such a method and the corresponding MR apparatus became known from DE 10 2016 218 000 B3.

Description of the Related Art

The present invention relates generally to the field of cooling of superconductive magnet arrangements that should/must be kept at very low (i.e., cryogenic) temperatures in operation. Such superconductive magnetic arrangements are used, for instance, in the field of magnetic resonance, for example in MRI (magnetic resonance imaging) tomographs or NMR (nuclear magnetic resonance) spectrometers.

Nuclear spin resonance is a high-performance method of instrumental analysis by which it is especially possible to determine the chemical composition of analysis samples. This involves injecting high-frequency pulses into the analysis sample which is present in a strong static magnetic field, and measuring the electromagnetic reaction of the sample. The strong static magnetic field, which is particularly homogeneous in NMR, is in many cases generated by means of superconductive magnet systems which, in analysis operation, have to be cooled for the purpose, usually with the aid of liquid helium as cryogenic fluid, to very low cryogenic temperatures close to absolute zero.

Such superconductive magnet systems are often also equipped with active cooling. In that case, the systems usually do not have a fluid tank at all in which the magnets are surrounded directly by cryogenic fluid. Instead, the coils of the magnet systems are disposed a vacuum vessel and are therefore "dry", i.e., cryogen-free, NMR analysis operation. In general, radiation shields surrounding the vacuum vessel, and therefore the magnet systems as well, are cooled directly by an active cooler, for example by a pulse tube cooler or a Gifford-MacMahon cooler.

These dry systems are generally more prone to faults in the cooling system, for example if the cold head fails, since, by contrast with bath-cooled magnet systems, there is no temperature buffer in the form of a generally liquid cryogen immediately surrounding the magnet system that can evaporate off in the event of failure of the cooling system and hence maintains the cryogenic temperature over a prolonged period of time. On the other hand, these bath-cooled systems, require a large number of personnel on commencement of operation and incur higher costs because large volumes (up to several thousands of liters) of liquid helium and nitrogen are used for cooling and filling, which have to be replaced again in the case of a quench. Accordingly, bath-cooled systems can never be operated autonomously.

The use of active cooling systems especially reduces the consumption of costly liquid helium, increases the availability of the NMR apparatus, and can also contribute to a reduction in construction height. The active cooling system may have a one-stage or else multistage design. In the case of multistage systems, a warmer cold stage usually cools the thermal radiation shield, and a colder cold stage the object to be cooled.

DE 20 2017 001 501 U1 describes a monitoring apparatus for the gradient system of an MR apparatus in order to ensure reliable operation of the magnetic coils. The apparatus comprises a temperature sensor that passes the temperature measurement results onward to a safeguard unit. The safeguard unit subsequently initiates various actions, for example issuing of warnings to the user, interruption of operation or alteration of parameters and sequence of measurement sequences. Additionally provided is a cooling system with which the elements (power boosters) of the gradient system can be actively cooled. A superconductive magnet system that can be brought autonomously to cryogenic temperatures is neither described nor indicated.

EP 3 454 071 A1 describes a method of monitoring the function of a cooling system of an MR device. Temperature sensors are provided in or assigned to various components as part of the magnetic resonance device, which provide corresponding temperature values as measurement data. The magnetic resonance device comprises a cooling system that utilizes water as coolant in the present case, which is used for cooling of components to be cooled in various cooling branches in which components can be serially cooled. It is also possible to use flow sensors. The data from the sensors are compared with comparative parameters and evaluated in order to conduct corresponding measures. There is no disclosure in this reference of cooling of the superconductor—especially in an autonomous manner—to cryogenic temperatures.

U.S. Pat. No. 8,729,894 B2 discloses a magnet system for MRI, comprising a vessel with liquid cryogen therein, and a superconductive magnet within the vessel, wherein the vessel is configured such that it is removably connected to a vacuum pump which is in turn configured such that it pumps cryogen from the vessel in order to reduce a pressure level within the vessel during the startup of the superconductive magnet to a pumped-down pressure level, and to increase the pressure level from the pumped-down pressure level to a normal operating pressure level during normal magnet operation. This document also describes a method of energizing the magnet, wherein, during what is called the ramping, the vessel containing the magnet can be evacuated. A cold head is disposed in a neck tube without affecting the vacuum in the vessel. However, in this arrangement, the neck tube is not filled with cryogen; instead, the cryostat contains liquid helium. With regard to the present invention, this reference is further-removed prior art since this concerns a "wet-cooled" coil system in which the measures of the invention described below would not be implementable at all and hence autonomous operation is impossible.

US 2006 0225433 A1 describes a monitoring system for prediction of component failures. The MRI scanner comprises a bath-cooled magnet. A multitude of sensors is provided for monitoring of the operation of the scanner. In the embodiment shown, sensors are provided in the cryostat interior in order to monitor the temperature and pressure of the vessel. Other sensors may be provided for monitoring of the cooling components of the cooling system, for example the cold head and the compressor etc. The sensors provide data relating to the operation of the scanner to the monitoring circuit. The monitoring circuit further includes an intermediate database and an algorithm, and also a processor. The intermediate database is configured such that it stores data relating to the operation of the scanner. The algorithm, cooperating with the processor, is configured such that it implements various calculation and processing operations on the data stored in the intermediate database. The data compared are transmitted to a user interface. This bath-cooled system does not enable autonomous cooling of the cryostat since the monitoring circuit does not pass on any information to control elements for pumps etc.

DE 10 2014 218 773 B4 discloses, in a cryostat, filling a cavity between the inside of the neck tube and the cooling arm of a cold head with a gas, for instance helium. In normal operation, the lowermost cooling stage of the cooling arm is close to the object to be cooled; for example, close thermal coupling is established via contact of the object to be cooled and the lowermost cooling stage to a small amount of liquid helium in the cavity. In the event of failure of the cooling, there will be a rise in the gas pressure in the cavity as a result of the heating; any liquid helium in the cavity will evaporate. The cold head, which is mounted so as to be movable, as a result of the rise in gas pressure in the cavity, is moved in the direction of the object to be cooled, which reduces the thermal coupling of cooling arm and object to be cooled. This cryostat can reduce the heat load through a cooling arm in the event of failure of the active cooling, but the construction complexity resulting from the movable suspension of the cold head is comparatively high. Moreover, on account of the high gas pressure in the cavity, there still remains not inconsiderable thermal coupling.

DE 10 2015 215 919 B4 describes a method and an apparatus for preliminary cooling of a cryostat with a heat pipe, as shown in DE 10 2014 218 773 B4. During a preliminary cooling phase, the object to be cooled is pre-cooled to a target temperature in the working range of the cryogenic working medium in which the heat pipe can work efficiently, with accomplishment of preliminary cooling by insertion of an accurately fitting short-circuit block with good thermal conductivity through the neck tube into the heat pipe, the free end of which is thermally connected to a high-performance cooling device, the other end of which is in contact with the thermal contact surface. In an intermediate phase after attainment of the target temperature, the short-circuit block is removed from the heat pipe and then, during the operating phase, heat is transferred through the heat pipe in condensation operation. This significantly reduces the time required for preliminary cooling of the cryostat to its operating temperature, in order thus to significantly shorten the duration of startup.

DE 10 2016 218 000 B3 already cited at the outset describes a cryostat arrangement having a vacuum vessel and a cooling object disposed within the vacuum vessel, which has a neck tube that leads to the cooling object, wherein a cooling arm of a cold head around which a sealed cavity is formed is disposed in the neck tube, which is sealed in a fluid-tight manner with respect to the cooling object and is filled with a cryogenic fluid in normal operation. Such a cryostat can be used for implementation of a generic method having the complexes of features defined at the outset, since the cryogen in the neck tube can be evaporated under reduced pressure for cooling.

A disadvantage of all the relevant methods known to date in this connection for cooling of a superconducting MR magnetic coil system which is dry in MR analysis operation, i.e., is not surrounded by cryogenic medium, is the fact that preliminary cooling of the magnet system—generally proceeding from room temperature—to a cryogenic temperature at which the superconductive magnetic coils can be energized always necessarily requires technical specialist personnel.

Autonomous operation of the MR apparatus in this phase of operation which must in principle always be implemented after the first installation of the system with the user, but also every time after intermediate heating of the superconductive magnet, for instance in the event of a quench, has not been possible, at least to date, without the involvement of costly, specially trained service technicians.

SUMMARY OF THE INVENTION

The present invention improves a method of the type specified at the outset for operating an MR apparatus having a "dry" superconductive MR magnetic coil system which is cryogen-free in MR analysis operation and is disposed in a vacuum vessel, and having a cryostat for cooling of said system, and also an apparatus for implementing said method by technical means that are uncomplicated, easily procurable or already generally exist as standard on the user's premises, in such a way that predominantly autonomous cooling, which is also optimized in a controlled manner with regard to particular process parameters, of the MR magnetic coil system to a cryogenic temperature at which the superconductive MR magnetic coil system can be energized is enabled in the simplest possible manner and without costly additional components.

The aforementioned improvements are achieved by the present invention in a surprisingly simple and effective manner with regard to the operating method by the following steps:

(a1) measuring the current temperature $T_{actual}$ in the MR magnetic coil system and comparing $T_{actual}$ with a definable first temperature target value $T1_{target}$ from which the vacuum vessel is to be pumped out;

(a2) if $T_{actual} > T1_{target}$, activating a vacuum pump disposed outside the vacuum vessel and opening a first barrier valve in a vacuum conduit that leads from the vacuum pump into the vacuum vessel;

(b1) measuring the current pressure $P_{actual}$ in the vacuum vessel and comparing $P_{actual}$ with a definable first target pressure $P1_{target}$ at which the MR magnetic coil system is to be cooled down to cryogenic temperature;

(b2) if $P_{actual} < P1_{target}$, activating the cold head for cooling of the cooling arm;

(c1) measuring the current temperature $T_{actual}$ in the MR magnetic coil system and comparing $T_{actual}$ with the first temperature target value $T1_{target}$;

(c2) if $T_{actual} < T1_{target}$, closing the first barrier valve and switching off the vacuum pump;

(d1) measuring the current temperature $T_{actual}$ in the MR magnetic coil system and comparing $T_{actual}$ with a definable second temperature target value $T2_{target}$ at which the operating temperature of the MR magnetic coil systems for MR measurements has been attained and maintaining the second temperature target value $T2_{target}$.

In the method of the invention, it is clearly necessary to establish a sufficiently high vacuum in the vacuum vessel before the temperature of the magnetic coil system is cooled to below the first temperature target value. The vacuum firstly serves to prevent thermal convection within the vessel, but secondly also to prevent icing within the vessel. After heating, there may be outgassing of volatile substances from the magnetic coil system, or if air gets into the interior of the vacuum vessel as will generally be the case in the first installation of the system. These usually gaseous impurities are first sucked out by the vacuum pump before the temperature is cooled to below a first temperature target value, $T1_{target}$, at which these volatile constituents condense out or begin to freeze. When the temperature goes below this value $T1_{target}$ in step a1 or in step c1, the vacuum pump can be switched off.

Accordingly, it is also important to detect the current reduced pressure in step b1 before the active cooling commences.

In order to assure the functionality of the MR system in a sustained manner, in the method of the invention, it is not simply the case that vacuum pump and cooling are started up together; instead, the parameters of temperature and pressure are first detected and the vacuum and cooling are actuated, separately if appropriate, dependence of the parameters. What is thus required is continuous detection of the temperature and pressure values, and sensible actuation of vacuum pump and cooling.

This results in an operating method which, with the aid of a simple control unit—effectively at the push of a button—automatically cools the superconductive magnet system and is sensitive to outside disruptions, creates error messages if necessary, and sends them—for example in email form. The magnetic coil system is operable in this way in a very substantially independent and autonomous manner without further involvement of technical personnel, and can instead be brought to operating temperature by the final customer themself.

Enormous savings in servicing, especially with regard to the use of trained personnel with the MR apparatus operator, and shorter outage periods of the instruments are the result. It becomes more compact, easier and less costly in every aspect overall.

The method of the invention for cooling cryostat-based MR instruments, especially for MRI, down to a temperature at which the magnet can be energized—reenergized if appropriate—is thus very substantially autonomous, which is not even suggested by the above-discussed prior art. Particularly the bath-based systems would be entirely unsuitable for this mode of operation.

An MR apparatus for implementation of the above-described method of the invention is equipped with a superconductive MR magnetic coil system which is disposed in a vacuum vessel and is dry, i.e. cryogen-free, in MR analysis operation, and with a cryostat for cooling the MR magnetic coil system, which comprises a neck tube which leads through an outer shell of the vacuum vessel to the MR magnetic coil system, wherein a cooling arm of a cold head is disposed at least partly within the neck tube, wherein a closed cavity which is formed around the cooling arm is sealed in a fluid-tight manner with respect to the MR magnetic coil system to be cooled and is at least partly filled with a cryogenic fluid in the normal operation of the MR apparatus.

With regard to such an MR apparatus, the object of the invention is achieved in that a vacuum pump and a first barrier valve are disposed outside the vacuum vessel in a vacuum conduit that leads from the vacuum pump into the vacuum vessel, in that a temperature sensor for measuring a current temperature $T_{actual}$ in the MR magnetic coil system and a first pressure sensor for measuring a current pressure $P_{actual}$ are present in the vacuum vessel, and in that a control unit is configured to detect and compare the current temperature $T_{actual}$ in the MR magnetic coil system with defined temperature target values, to detect and compare the current pressure $P_{actual}$ in the vacuum vessel with defined pressure target values, and to actuate the first barrier valve, the vacuum pump and the cold head.

A cryostat suitable for implementation of the above-described method of the invention contributes to the achievement of the object of the invention in that a fluid conduit is provided, which opens at one end into a cavity surrounding the cooling arm of the cold head, and at the other end into a pressure vessel filled with a cryogenic fluid outside the neck tube, and in that there is a second sensor for measurement of the current pressure $P_{HR}$ in the cavity.

Finally, an apparatus for implementation of the method of the invention requires an electronic control unit configured to detect and compare a current temperature $T_{actual}$ in the MR magnetic coil system with defined temperature target values, and to detect and compare the current pressure $P_{actual}$ in the vacuum vessel with defined pressure target values, and which controls the various components by means of an algorithm taking account of various measurements and parameters. The control unit is essential to the functionality of the autonomous cooling, since it requires continuous detection of the temperature and pressure values and sensible actuation of vacuum pump and cooling depending on the existing measurements by means of the algorithm set up for the purpose.

The control unit contributes to the achievement of the object of the invention in that in it has a measurement unit in which a temperature sensor for measuring the current temperature $T_{actual}$ in the MR magnetic coil system and a pressure sensor for measuring the current pressure $P_{actual}$ in the vacuum vessel are connected. The control unit also comprises an actuation unit for opening and closing the first barrier valve, for activating and deactivating the vacuum pump and for activating and deactivating the cold head and contains a processor unit which is disposed as interface between the measurement unit and the actuation unit for comparison of the sensor parameters detected with the target parameters and the processing of the data for actuation of cold head, vacuum pump and barrier valve.

Particular advantages of the autonomous cooling method of the invention include the following:
1. Automated cooling procedure in the first startup of an MR apparatus with superconductive magnetic coil system.
2. Automated cooling procedure after overheating of the magnetic coil system after a failure of the cooling unit or as a result of a quench ("auto cooling").
3. Permanent temperature and pressure measurements enable
    a) automated verification of the current temperature $T_{actual}$ in the MR magnetic coil system; and
    b) automated verification of the current pressure $P_{actual}$ in the vacuum vessel.

Advantageous variants of the method of the invention may also be those in which, in a further step, the pressure $P_{HR}$ of the cryogenic fluid in the neck tube is monitored by means of a manometer at the feed for cryogenic fluid, especially helium, and kept between 900 mbar and 1100 mbar.

It is a feature of certain embodiments of the method of the invention that the neck tube is connected via a first valve V1 to a helium feed, wherein, in a step (e), helium is fed into the neck tube and liquefied. This autonomously replenishes the helium reservoir in the neck tube with an active cold head, in which the helium can condense out at an appropriate pressure. The helium reservoir constitutes a cold buffer, for example in the event of failure of the cooling. The heat pipe that results in this manner guides the heat particularly effectively from the coil to the cold head, and simultaneously decouples the mechanical vibrations of the cooler.

Also provided is a class of embodiments of the invention in which the feed conduit to the neck tube is connected via a further valve V2 to the vacuum pump, and the neck tube is pumped dry, comprising the steps of (a3) measuring the current temperature $T_{actual}$ in the MR magnetic coil system and comparing $T_{actual}$ with a definable third temperature target value $T3_{target}$ from which the neck tube is to be pumped out; and (a4) if $T_{actual} > T3_{target}$, actuating a vacuum pump and opening the second barrier valve V2 in a vacuum conduit that leads from the vacuum pump to the neck tube.

$T3_{target}$ is established in the event of prolonged heating of the MR magnetic coil system. In this case, it is necessary first to free the neck tube of extraneous gases by evacuating in order that these do not freeze out on cooling down to cryogenic temperatures and hence adversely affect the functionality of the cryostat. Such icing, for example in safety valves, also constitutes a risk because it may no longer possible to open these under elevated pressure.

It is advantageous when steps a3 and a4 are conducted before the cold head is activated. After pumping-out step a4, the helium is filled again with fresh helium, preferably via a helium feed. This is accomplished by switching off the pump and (after a brief wait time) opening the valve V1 in order that the gaseous helium can flow into the evacuated neck tube. The second pressure sensor is used to check when the feed conduits and the neck tube have filled with helium, and a stable pressure value is then established. It is also possible to pump during the charging at the neck tube and hence to generate a lower temperature in the neck tube for a certain time.

Advantageous developments of these method variants are those wherein, in the event of failure of the cold head, in a step (d2), the vacuum pump is used to pump away the liquid helium in the neck tube in order to cool the MR magnetic coil system. The liquid helium constitutes a cold buffer that can be utilized in order to provide emergency cooling. When the liquid helium is pumped out, a lower pressure is established, the effect of which is that the helium is converted to the gaseous state, and the heat of evaporation removes additional heat from the cryostat and hence provides additional cooling.

Preferred embodiments of the method of the invention are characterized in that the definable temperature target values $T1_{target}$, $T2_{target}$ and $T3_{target}$ and the definable pressure target value $P1_{target}$ are selected from the following ranges of values:

$5K \leq T1_{target} \leq 20K$, preferably about 8K;
$3K \leq T2_{target} \leq 5K$, preferably about 4.2K;
$250K \leq T3_{target} \leq 300K$, preferably about 280K
$10^{-4}$ mbar $\leq P1_{target} \leq 10^{-1}$ mbar, preferably about $10^{-3}$ mbar These values are used when the MR coil system contains LTSs (low-temperature superconductors), which are typically operated at the temperature of liquid helium, i.e., less than 4.2 K. The cryogenic fluid in the neck tube is accordingly helium. $T1_{target}$ corresponds to the temperature from which the vacuum in the vacuum vessel must be re-established. $T2_{target}$ corresponds to the operating temperature of the MR magnetic coil system when LTSs are used. $T2_{target}$ corresponds to the operating temperature of the MR magnetic coil system when LTSs are used. $P1_{target}$ is the minimum vacuum in the vacuum chamber from which it can be assumed that only a small amount of residual gases is present and therefore the cooling can be commenced.

The scope of the present invention also includes the magnetic resonance apparatus already described above for implementation of the method of the invention. In advantageous embodiments, this can be configured in such a way that the vacuum pump has an at least 2-stage construction and has a turbomolecular pump and a backing pump therefor, preferably a membrane pump. The two pumps are preferably connected in series. In general, only these two-stage pumps achieve a sufficiently high vacuum.

In addition, the cryostat—required for the MR apparatus of the invention, which has likewise already been described above—for cooling of the MR magnetic coil system can be developed in that the end of the fluid conduit connected to the cavity opens via a second barrier valve into a region of vacuum conduit between the first barrier valve and the turbomolecular pump, and in that the end of the fluid conduit connected to the pressure vessel opens via a third barrier valve into the region of the vacuum conduit between the turbomolecular pump and its backing pump. The separate valves have the effect that the helium feed is arranged separately from the vacuum pumps, in order that the helium feed is not pumped dry in the case of pumping at the neck tube.

The scope of the present invention also includes a control unit for implementation of the method of the invention as likewise already described above.

An exemplary class of embodiments of the control unit of the invention is characterized in that a second pressure sensor for measuring the current pressure $P_{HR}$ in the cavity surrounding the cooling arm of the cold head is connected to the measurement unit, and in that the actuation unit is configured to open and close the second and third barrier valves.

When the magnetic coil system is still warm, the measurement of $P_{HR}$ serves to monitor the pressure in the initial purging of the neck tube with He. This involves alternately using the vacuum pump, preferably the membrane pump when a two-stage pump is used, to empty the neck tube via V2 and to fill it with helium via V1, such that a minimum amount of extraneous gases is present in the neck tube prior to the cooling.

The measurement of $P_{HR}$ also serves, on completion of cooling, to monitor whether sufficient helium is present in the pressure vessel to monitor the filling of the neck tube with helium. It also serves to verify the manometer setting in the helium pressure vessel during operation, in order that no elevated or reduced pressure arises in the feed conduit.

In practice, useful developments of these embodiments have been found to be those in which there is a connection from the neck tube to the vacuum pump, in which case the control unit implements the control of V2 to the vacuum pump. The vacuum pump firstly serves, in the case of excessive heating of the cryostat, first to completely free the neck tube of extraneous gases before the cooling begins. This prevents the partial icing of extraneous substances, which can impair the functionality of the cold head. Secondly, the vacuum pump can then viably be used in the cold state in order to delay the heating of the cryostat as a result of pumping-out of the helium present in the event of failure of the cold head. The control unit controls the actuation of V2 and vacuum pump depending on the parameters measured.

Alternatively or additionally, it is a feature of other developments that there is a connection from a helium gas feed to the neck tube, and that the control unit implements the control of the He feed via the valve V1. In this way, after power or water failures, helium can be liquefied in a controlled manner in order to refill the small reservoir in the neck tube. This ensures that there is always sufficient liquid helium in the neck tube to survive for a few hours without quench in the event of a cooler failure.

The exemplary embodiments include applications of the method variants of the invention and devices in the field of magnetic resonance, especially in NMR spectroscopy and in MRI apparatuses.

Further advantages of the invention will be apparent from the description and the drawing. It is likewise possible in accordance with the invention for the aforementioned features and those set out in further detail each to be used individually on their own, or two or more together in any combination. The embodiments detailed and described should not be regarded as a conclusive enumeration, but instead have illustrative character in respect of the delineation of the invention.

BRIEF DESCRIPTION OF THE DRAWINGS

The invention is shown in the drawing and is elucidated in detail by working examples. The figures show.

DETAILED DESCRIPTION

The present invention is fundamentally concerned with a specifically modified method of operating a magnetic resonance apparatus 10 ("MR apparatus"), especially comprising the autonomous cooling of a superconductive magnet arrangement.

Figure 1:
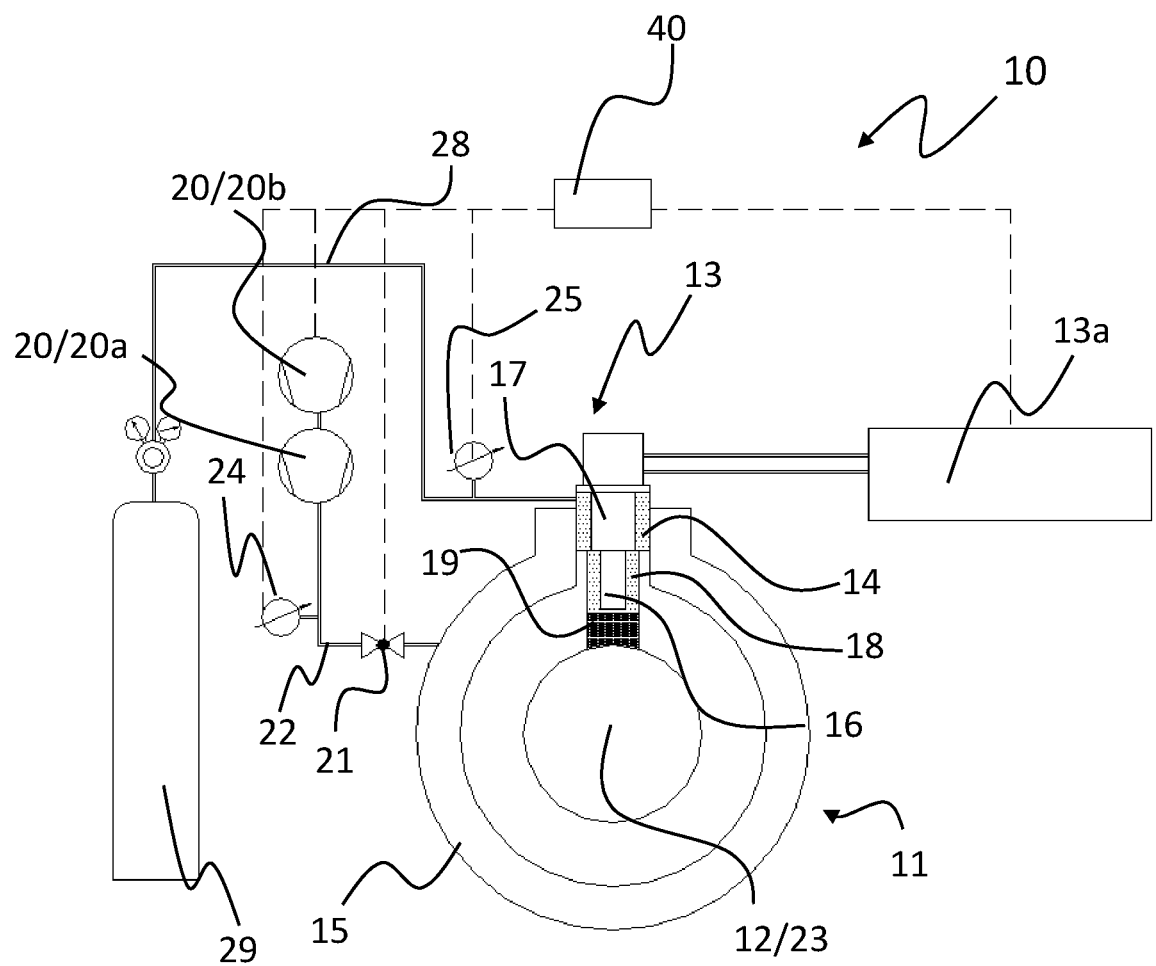
FIG. 1 a schematic vertical section diagram of an embodiment of the magnetic resonance apparatus with just one valve for performance of the auto-cooling method of the invention.

FIG. 1 shows a schematic of a particularly simple embodiment of the magnetic resonance apparatus 10 with just one valve for implementation of the auto-cooling method of the invention.

The MR apparatus 10 comprises a vacuum vessel 11 with a superconductive MR magnetic coil system 12. In MR operation, this MR magnetic coil system 12 is dry, i.e. cryogen-free. Cooling is effected by means of a cryostat 13 which is connected to a compressor 13a. The cryostat 13 includes a neck tube 14 which is guided through an outer shell 15 of the vacuum vessel 11 to the MR magnetic coil system 12. Within the neck tube 14 of the cryostat 13 is a cooling arm 16 of a cold head 17. A cavity 18 is formed around the cooling arm 16. The cavity 18 is sealed in a fluid-tight manner with respect to the MR magnetic coil system 12 to be cooled. In the operating state shown here, the cavity 18 is partly filled with a cryogenic fluid 19 (e.g. liquid helium), and gaseous helium.

Outside the vacuum vessel 11 is disposed a vacuum pump 20, in the form here of a 2-stage vacuum pump 20. Vacuum pump 20 here encompasses a turbomolecular pump 20a with a backing pump 20b (for example a membrane pump). The vacuum pump 20 is connected by a first barrier valve 21 (barrier valve V3) via a vacuum conduit 22 to the vacuum vessel 11.

In the MR magnetic coil system 12, there is a temperature sensor 23 for measuring a current temperature $T_{actual}$ in the MR magnetic coil system 12. A first pressure sensor 24 connected via the vacuum conduit 22 to the vacuum vessel 11 measures a current pressure $P_{actual}$ in the vacuum vessel 11. A control unit 40 detects and compares the current temperature $T_{actual}$ in the MR magnetic coil system 12 with defined temperature target values. In addition, the control unit 40 detects and compares the current pressure $P_{actual}$ in the vacuum vessel 11 with defined pressure target values. The control unit 40 is also configured such that it can actuate the first barrier valve 21, the vacuum pump 20 and the compressor 13a of the cold head 17.

The control unit 40 comprises a measurement unit, an actuation unit and a processor unit. The temperature sensor 23 is connected to the measurement unit and is used to measure the current temperature $T_{actual}$ in the MR magnetic coil system 12. Additionally connected to the measurement unit is the pressure sensor 24, with which the current pressure $P_{actual}$ in the vacuum vessel 11 is measured. The actuation unit is connected to the first barrier valve 21, which can open and close the actuation unit. In addition, the actuation unit is connected to the vacuum pump 20 and the cold head 17 (or the compressor 13a), which can activate and deactivate the actuation unit. The processor unit is disposed between the measurement unit and the actuation unit. The processor unit compares the parameters detected by the temperature sensor 23 and the pressure sensor 24 with the target parameters. These data are processed by the processor unit and utilized for actuation of the cold head 17, the vacuum pump 20 and the barrier valve 21.

By means of a second pressure sensor 25 connected to a connection 28, which leads from a helium feed 29 into the cavity 18 of the cryostat 13, it is possible to measure the current pressure $P_{HR}$ in cavity 18. The second pressure sensor 25 is likewise connected to the measurement unit of the processor unit.

Figure 2:
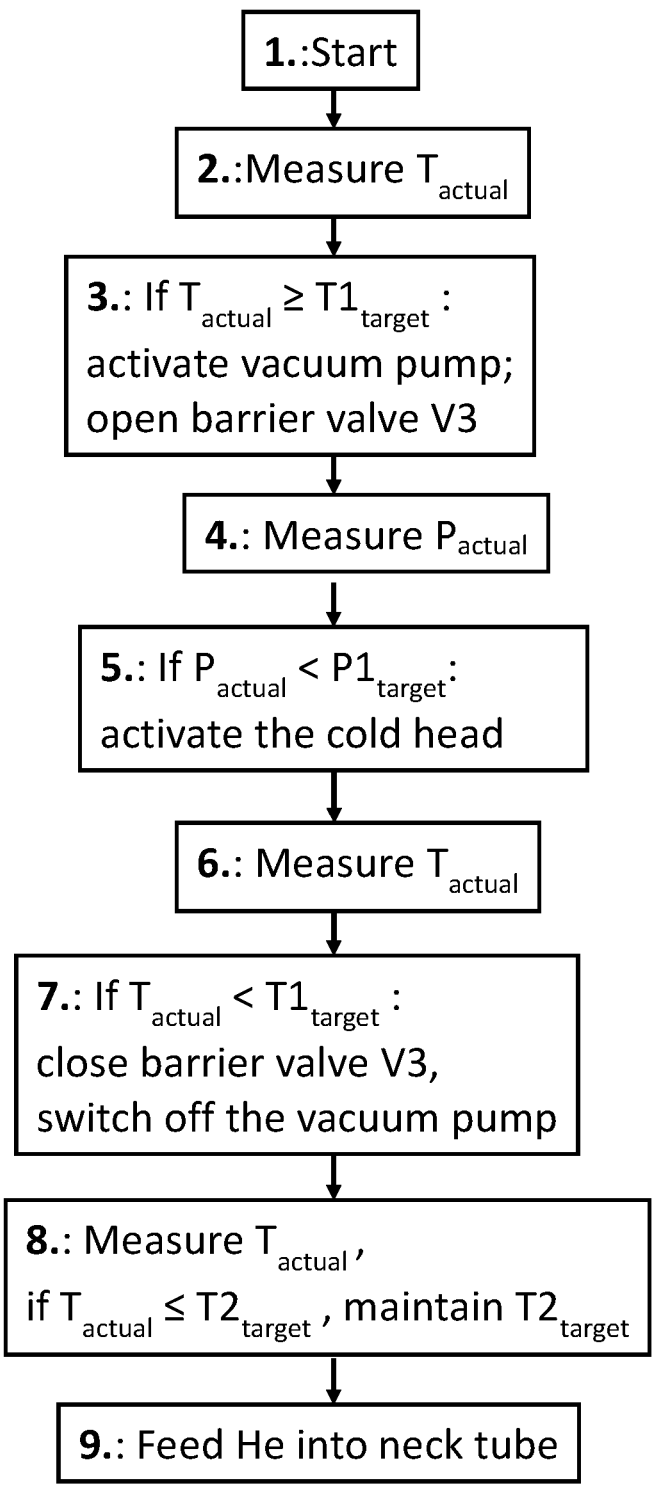
FIG. 2 a flow diagram of the basic method sequence of the auto-cooling method of the invention in embodiments with just one valve as in FIG. 1.

The basic sequence of the cooling method of the invention for embodiments with just one valve is shown as a flow diagram in FIG. 2 and discussed in the example below.

The sequence of the autonomous cooling method, in execution variants, may comprise the following steps:

1. The operation of the MR apparatus is started. In this state of operation, the barrier valve V3 is closed and the vacuum pump is deactivated. The helium feed is connected directly to the neck tube. The gaseous helium is liquefied, and the liquid helium cools the MR magnetic arrangement. The liquefaction proceeds until the system is at thermodynamic equilibrium.

2. The temperature sensor measures the current temperature $T_{actual}$ in the MR magnetic coil system.

3. The temperature $T_{actual}$ is transmitted to the control unit, where it is compared in the processor unit with a defined temperature target value $T1_{target}$, which is 8 K here. When $T_{actual} \geq T1_{target}$, the control unit becomes active. The control unit opens the barrier valve V3 and activates the vacuum pump. An increase in temperature occurs when, for example, the compressor fails, and hence the cooling of the MR magnetic coil system. There is an increased input of heat from the environment into the MR magnetic coil system. However, this does not immediately result in heating of the MR magnetic coil system. First of all, the liquid helium evaporates, and hence the MR magnetic coil system is cooled. The evaporated helium is removed via a pressure release valve. In the event of a failure of the compressor for a prolonged period, however, it may be the case that the helium evaporates completely and the MR magnetic coil system is quenched and heats up. The heating releases gases in the vacuum vessel from the MR magnetic coil system. These gases worsen the vacuum, which in turn has an adverse effect on thermal insulation. There is a risk of excessively rapid and uncontrolled heating. In order to prevent this, the control unit becomes active at an early stage in order to open the barrier valve V3 and to activate the vacuum pump, in order that the vacuum in the vacuum vessel is maintained for as long as possible and hence the input of heat into the MR magnetic coil system can be reduced to such an extent that uncontrolled heating of the MR magnetic coil system is prevented.

4. The pressure sensor measures the current pressure $P_{actual}$ of the vacuum vessel.

5. The pressure $P_{actual}$ is transmitted to the control unit, where it is compared in the processor unit with a defined pressure target value $P1_{target}$, which is $10^{-3}$ mbar here. When $P_{actual} < P1_{target}$, the control unit becomes active. The control unit activates the cold head for cooling of the cooling arm. The pressure target value $P1_{target}$ ensures that there is a sufficiently high vacuum and the vacuum vessel and hence the input of heat into the MR magnetic coil system is reduced. Once this value has been attained, the cold head is cooled down again in order to convert the MR apparatus back to normal operation.

6. The temperature sensor measures the current temperature $T_{actual}$ in the MR magnetic coil system.

7. The temperature $T_{actual}$ is transmitted to the control unit, where it is compared in the processor unit with the defined temperature target value $T1_{target}$. When $T_{actual} < T1_{target}$, the control unit becomes active. The control unit closes the barrier valve V3 and deactivates the vacuum pump.

8. The temperature sensor also measures the current temperature $T_{actual}$ in the MR magnetic coil system. The temperature $T_{actual}$ is transmitted to the control unit, where it is compared in the processing unit to a defined temperature target value $T2_{target}$, which is 4.2 K here. When $T_{actual} \leq T2_{target}$, the control unit becomes active. The control unit sends the message to the cold head to maintain the temperature.

9. Gaseous helium is supplied again to the neck tube. The temperature $T_{actual}$ is sufficient to liquefy the gaseous helium. The liquid helium cools the MR magnetic coil system, and the liquefaction proceeds until the system is at thermodynamic equilibrium.

Figure 3:
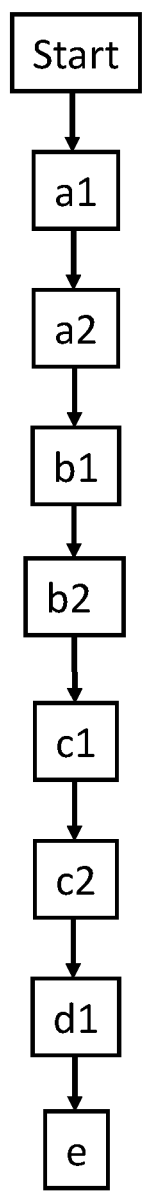
FIG. 3 a schematic flow diagram with the method steps according to the claims in embodiments with just one valve as in FIG. 1.

FIG. 3 shows a schematic flow diagram comprising the method steps according to the claims for embodiments with just one valve, and is discussed in the example below.

Start: The MR apparatus is put into operation.

a1: The current temperature $T_{actual}$ in the MR magnetic coil system is measured and compared with the definable first temperature target value $T1_{target}$ from which the vacuum vessel is to be pumped out.

a2: When $T_{actual} > T1_{target}$, the vacuum pump disposed outside the vacuum vessel is activated, and the first barrier valve in the conduit leading from the vacuum pump into the vacuum vessel is opened.

b1: The current pressure $P_{actual}$ in the vacuum vessel is measured and compared with a definable first pressure target value $P1_{target}$ at which the MR magnetic coil system is to be cooled down to cryogenic temperature.

b2: When $P_{actual} < P1_{target}$, the cold head for cooling of the cooling arm is activated.

c1: The current temperature $T_{actual}$ in the MR magnetic coil system is measured and compared with the first temperature target value $T1_{target}$.

c2: When $T_{actual} < T1_{target}$, the first barrier valve is closed and the vacuum pump is switched off.

d1: The current temperature $T_{actual}$ in the MR magnetic coil system is measured and compared with the second temperature target value $T2_{target}$ at which the operating temperature of the MR magnetic coil system for MR measurements is attained. The second temperature target value $T2_{target}$ is maintained.

e: Helium is fed into the neck tube and liquefied.

Figure 4:
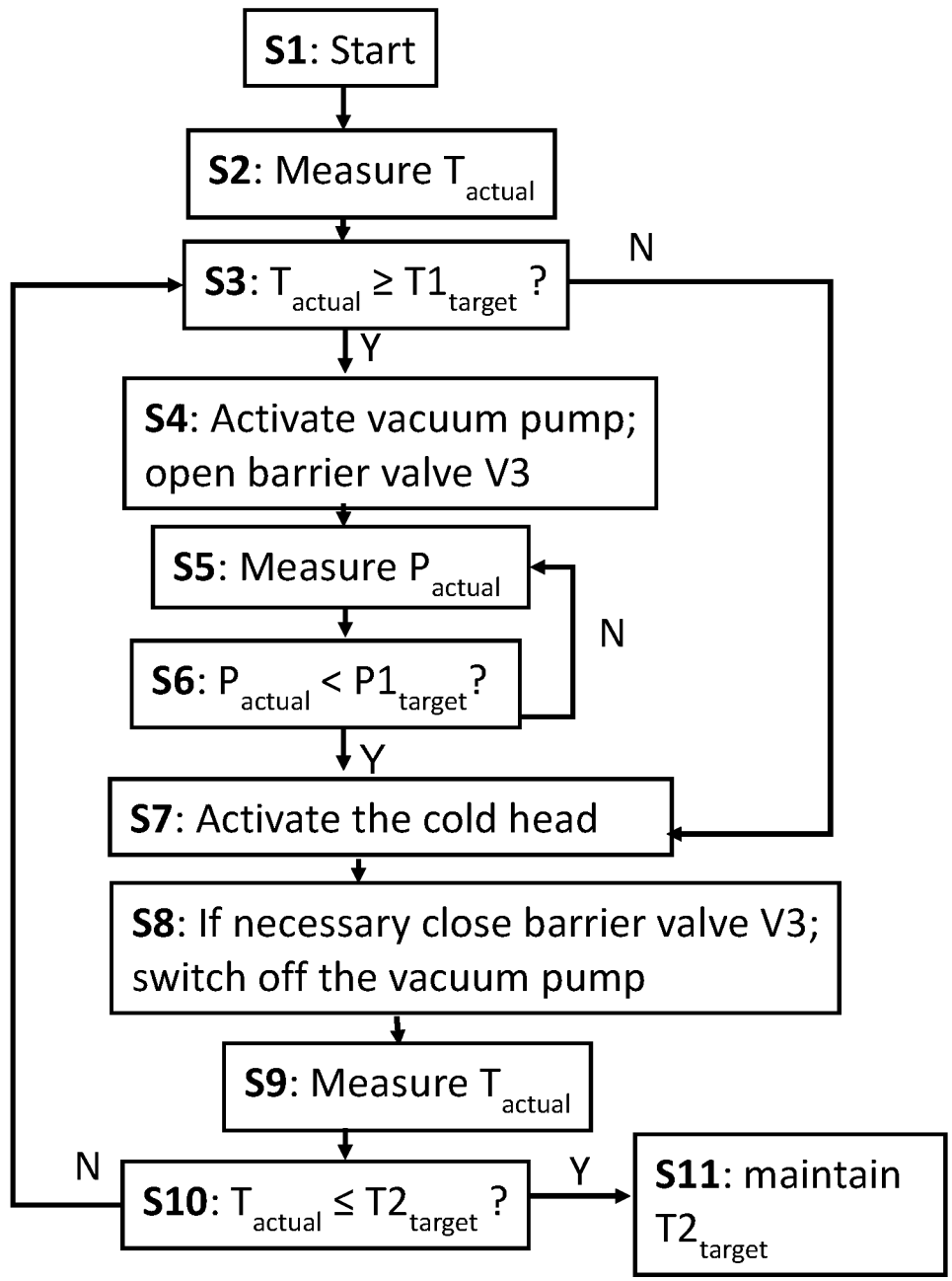
FIG. 4 a flow diagram of the basic sequence of the auto-cooling method of the invention in the form of an algorithm as is to proceed in a corresponding program in the control unit, specifically for embodiments with just one valve as in FIG. 1.

The basic sequence of the cooling method of the invention in the form of an algorithm as is to proceed in a corresponding program in the control unit for embodiments with just one valve is shown as a flow diagram in FIG. 4 and discussed further below.

The algorithm can be divided into the following steps:

S1: The control unit is started.

S2: The temperature sensor of the MR magnetic coil system which is connected to the measurement unit measures the current temperature $T_{actual}$.

S3: The temperature $T_{actual}$ is compared in the processor unit with the value $T1_{target}$, and it is verified whether $T_{actual} T1_{target}$. If the test is negative, the algorithm is continued at S7. If the test is positive, the actuation unit activates the vacuum pump and opens the barrier valve V3.

S4: The actuation unit activates the vacuum pump and opens the barrier valve V3.

S5: The pressure sensor for the vacuum vessel which is connected to the measurement unit measures the current pressure $P_{actual}$.

S6: The pressure $P_{actual}$ is compared in the processor unit with the value $P1_{target}$, and it is verified whether $P_{actual} < P1_{target}$. If the test is negative, the pressure $P_{actual}$ is measured again (and the algorithm is continued at S5). If the test is positive, the actuation unit activates the cold head.

S7: The actuation unit activates the cold head.

S8: If necessary, the actuation unit closes the barrier valve V3 and deactivates the vacuum pump.

S9: The temperature sensor of the MR magnetic coil system which is connected to the measurement unit measures the current temperature $T_{actual}$.

S10: The temperature $T_{actual}$ is compared in the processor unit with the value $T2_{target}$, and it is verified whether $T_{actual} \geq T2_{target}$. If the test is negative, the algorithm is continued at S3. If the test is positive, the actuation unit signals that the cold head is to maintain the temperature $T2_{target}$.

S11: The actuation unit signals to the cold head that it should maintain the temperature $T2_{target}$.

Figure 5:
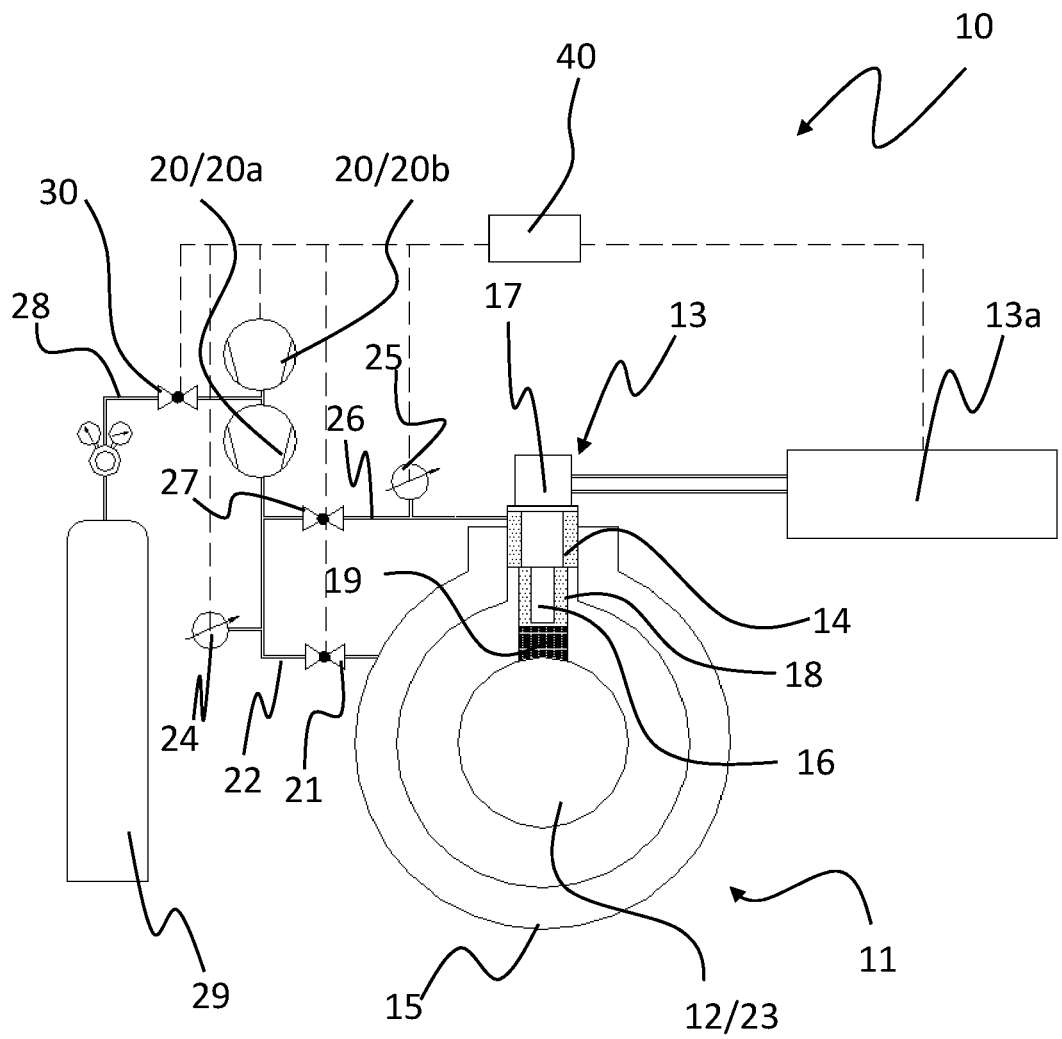
FIG. 5 a schematic vertical section diagram of an embodiment of the magnetic resonance apparatus having three valves for performance of the auto-cooling method of the invention.

FIG. 5 shows a schematic of a particularly simple embodiment of a magnetic resonance apparatus 10 (MR apparatus) having three valves for implementation of the auto-cooling method of the invention.

The MR apparatus 10 comprises the vacuum vessel 11 containing the superconductive MR magnetic coil system 12. In MR analysis operation, this MR magnetic coil system 12 is dry, i.e cryogen-free. Cooling is effected by means of a cryostat 13 connected to the compressor 13a. The cryostat 13 comprises a neck tube 14 which is guided through the outer shell 15 of the vacuum vessel 11 to the MR magnetic coil system 12. The cooling arm 16 of the cold head 17 is disposed in the neck tube 14 of the cryostat 13. The cavity 18 is formed around the cooling arm 16. The cavity 18 is sealed in a fluid-tight manner with respect to the MR magnetic coil system 12 to be cooled. In the state of operation shown here, the cavity 18 is partly filled with cryogenic fluid 19 (e.g. liquid helium), and gaseous helium.

The vacuum pump 20 is disposed outside the vacuum vessel 11 and is designed here as a 2-stage vacuum pump 20. Vacuum pump 20 here comprises the turbomolecular pump 20a with the backing pump 20b (for example a membrane pump). The vacuum pump 20 is connected by the first barrier valve 21 (barrier valve V3) via the vacuum conduit 22 to the vacuum vessel 11. In addition, the vacuum pump 20 is connected by a second barrier valve 27 (barrier valve V2) via a connection 26 to the neck tube 14.

In the MR magnetic coil system 12, the temperature sensor 23 is present for measurement of a current temperature $T_{actual}$ in the MR magnetic coil system 12. The first pressure sensor 24, which is connected via the vacuum conduit 22 to the vacuum vessel 11, measures a current pressure $P_{actual}$ in the vacuum vessel 11. The second pressure sensor 25, which is connected via the connection 26 to the neck tube 14, measures a current pressure $P_{HR}$ in the neck tube. The control unit 40 detects and compares the current temperature $T_{actual}$ in the MR magnetic coil system 12 with defined temperature target values. In addition, the control unit 40 detects and compares the current pressure $P_{actual}$ in the vacuum vessel 11 with defined pressure target values. The control unit 40 is also configured such that it can actuate the first barrier valve 21, the vacuum pump 20 and the compressor 13a of the cold head 17.

The control unit 40 comprises the measurement unit, the actuation unit and the processor unit. Connected to the measurement unit is the temperature sensor 23, with which the current temperature $T_{actual}$ in the MR magnetic coil system 12 is measured. Additionally connected to the measurement unit is the first pressure sensor 24, with which the current pressure $P_{actual}$ in the vacuum vessel 11 is measured. Likewise connected to the measurement unit is the second pressure sensor 25, with which the current pressure $P_{HR}$ in the neck tube 14 is measured. The actuation unit is connected to the first barrier valve 21, the second barrier valve 27 and a third barrier valve 30 (barrier valve V1), which can open and close the actuation unit. Barrier valve 30 is integrated into connection 28 that connects the helium feed 29 and the neck tube 14. In addition, the actuation unit is connected to the vacuum pump 20 and via the compressor 13a to the cold head 17, which can activate and deactivate the actuation unit. The processor unit is disposed between the measurement unit and the actuation unit. The processor unit compares the parameters detected by the temperature sensor 23, the pressure sensor 24 and the pressure sensor 25 with the target parameters. These data are processed by the processor unit and utilized for control of the cold head 17, the vacuum pump 20 and the barrier valves 21, 27, 30.

Figure 6:
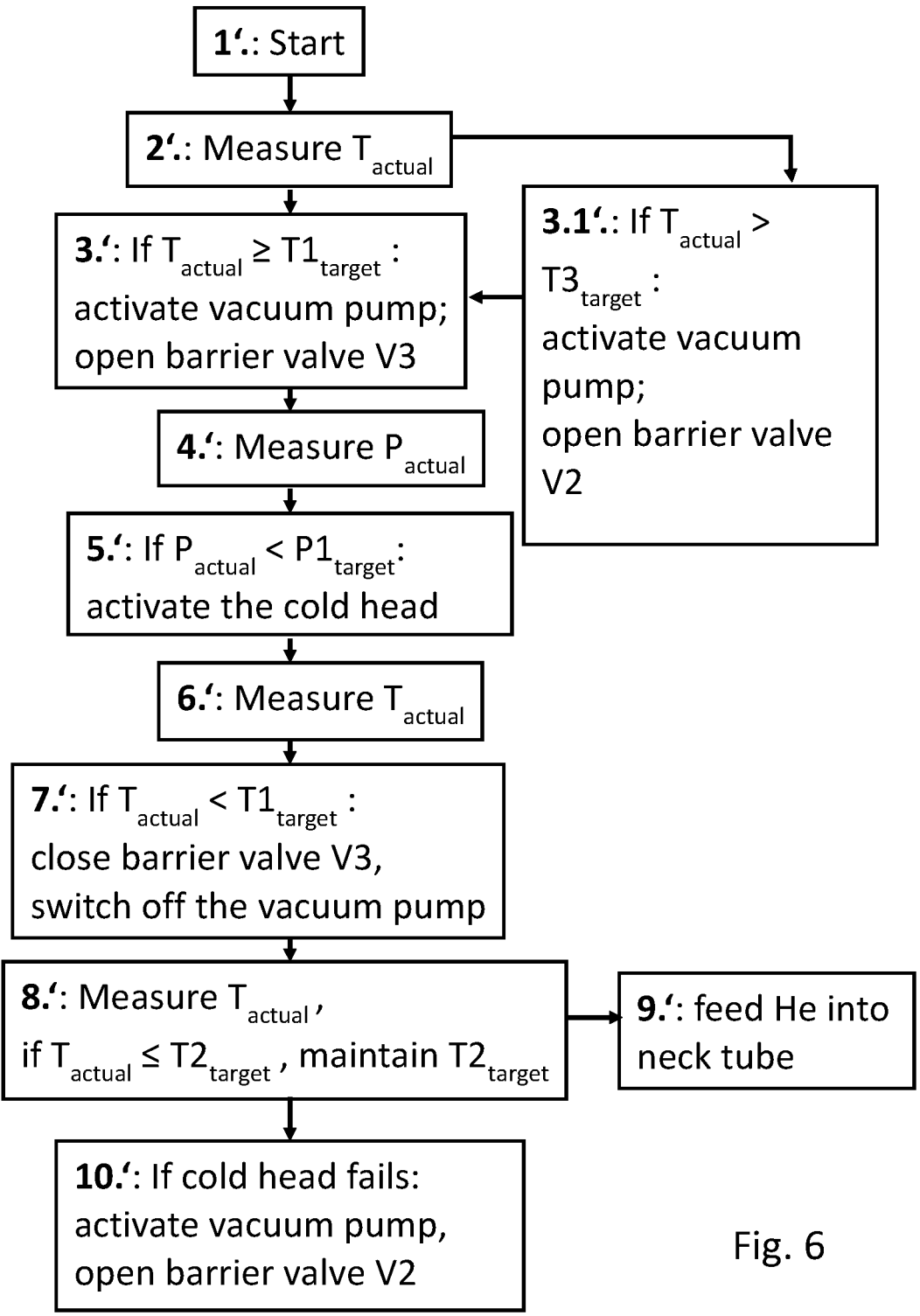
FIG. 6 a flow diagram of the basic method sequence of the auto-cooling method of the invention in embodiments with three valves as in FIG. 5.

The basic sequence of the cooling method of the invention for embodiments having three valves is shown as a flow diagram in FIG. 6, and discussed further below.

The sequence of the autonomous cooling method, in execution variant, may comprise the following steps:

1'. The operation of the MR apparatus is started. In this state of operation, the barrier valves V1, V2 and V3 are closed and the vacuum pump is deactivated. The helium feed is connected to the neck tube via barrier valve V1. The gaseous helium is liquefied and the liquid helium cools the MR magnetic arrangement. The liquefaction proceeds until the system is at thermodynamic equilibrium.

2'. The temperature sensor measures the current temperature $T_{actual}$ in the MR magnetic coil system.

3'. The temperature $T_{actual}$ is transmitted to the control unit, where it is compared in the processing unit to a defined temperature target value $T1_{target}$, which is 8 K here. When $T_{actual} \geq T1_{target}$, the control unit becomes active. The control unit opens the barrier valve V3 and activates the vacuum pump.

3.1'. At the same time, the processor unit compares the temperature $T_{actual}$ with a defined temperature target value $T3_{target}$, which is 280 K here. When $T_{actual} > T3_{target}$, the control unit becomes active. The control unit opens the barrier valve V2 and activates the vacuum pump. An increase in temperature occurs when, for example, the compressor fails, and hence the cooling of the MR magnetic coil system. There is an increased input of heat from the environment into the MR magnetic coil system. However, this does not immediately result in heating of the MR magnetic coil system. The control unit becomes active when the temperature target value $T3_{target}$ is exceeded. The barrier valve V2 is opened and the helium gas is pumped out, as a result of which the MR magnetic coil system is actively cooled. In the event of a failure of the compressor for a prolonged period, however, it may be the case that the helium evaporates completely and the MR magnetic coil system is quenched and heats up. The heating releases gases in the vacuum vessel from the MR magnetic coil system. These gases worsen the vacuum, which in turn has an adverse effect on thermal insulation. There is a risk of excessively rapid and uncontrolled heating. In order to prevent this, the control unit becomes active at an early stage in order to open the barrier valve V3 and to activate the vacuum pump, in order that the vacuum in the vacuum vessel is maintained for as long as possible and hence the input of heat into the MR magnetic coil system can be reduced to such an extent that uncontrolled heating of the MR magnetic coil system is prevented.

4'. The pressure sensor measures the current pressure $P_{actual}$ of the vacuum vessel.

5'. The pressure $P_{actual}$ is transmitted to the control unit, where it is compared in the processing unit to a defined pressure target value $P1_{target}$, which is $10^{-3}$ mbar here. When $P_{actual} < P1_{target}$, the control unit becomes active. The control unit activates the cold head for cooling of the cold arm. The pressure target value $P1_{target}$ ensures that a sufficiently large vacuum exists in the vacuum vessel, and hence the input of heat into the MR magnetic coil system is reduced. Once this value has been attained, the cold head is cooled down again in order to be able to put the MR apparatus back into normal operation.

6'. The temperature sensor measures the current temperature $T_{actual}$ in the MR magnetic coil system.

7'. The temperature $T_{actual}$ is transmitted to the control unit, where it is compared in the processor unit with the defined temperature target value $T1_{target}$. When $T_{actual} < T1_{target}$, the control unit becomes active. The control unit closes the barrier valve V3 and deactivates the vacuum pump.

8'. The temperature sensor also measures the current temperature $T_{actual}$ in the MR magnetic coil system. The temperature $T_{actual}$ is transmitted to the control unit, where it is compared in the processing unit to a defined temperature target value $T2_{target}$, which is 4.2 K here. When $T_{actual} \leq T2_{target}$, the control unit becomes active. The control unit sends the message to the cold head to maintain the temperature.

9'. Barrier valve V2 is closed and barrier valve V1 is opened in order to supply gaseous helium to the neck tube again. The temperature $T_{actual}$ is sufficient to liquefy the gaseous helium. The liquid helium cools the MR magnetic arrangement, and the liquefaction proceeds until the system is at thermodynamic equilibrium.

10'. Alternatively, in the event of a failure of the cold head, the control unit can reactivate the vacuum pump and open the barrier valve V2.

Figure 7:
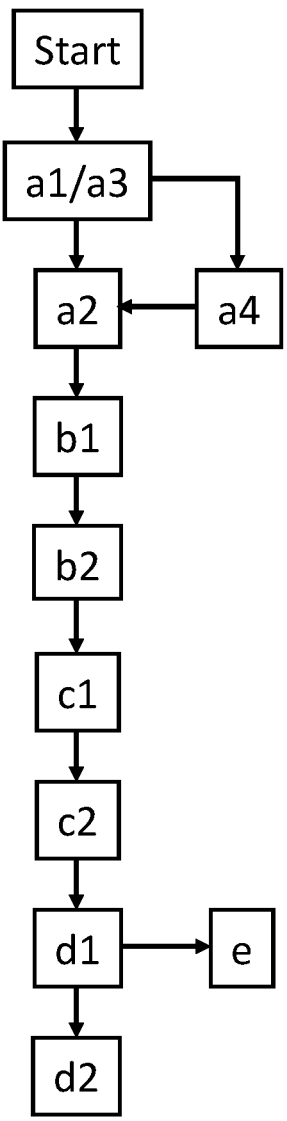
FIG. 7 a schematic flow diagram with the method steps according to the claims in embodiments with three valves as in FIG. 5.

FIG. 7 shows a schematic flow diagram comprising the method steps according to the claims for embodiments having three valves, which are discussed further below.

Start: The MR apparatus is put into operation.

a1/a3: The current temperature $T_{actual}$ in the MR magnetic coil system is measured and compared with the definable first temperature target value $T1_{target}$ from which the vacuum vessel is to be pumped out. The current temperature $T_{actual}$ is also compared with the definable third temperature target value $T3_{target}$.

a4: When $T_{actual} > T3_{target}$, the vacuum pump disposed outside the vacuum vessel is activated, and the second barrier valve V2 in the vacuum conduit leading from the vacuum pump to the neck tube is opened.

a2: When $T_{actual} > T1_{target}$, the vacuum pump disposed outside the vacuum vessel is activated, and the first barrier valve in the conduit leading from the vacuum pump into the vacuum vessel is opened.

b1: The current pressure $P_{actual}$ in the vacuum vessel is measured and compared with a definable first pressure target value $P1_{target}$ at which the MR magnetic coil system is to be cooled down to cryogenic temperature.

b2: When $P_{actual} < P1_{target}$, the cold head is activated for cooling of the cooling arm.

c1: The current temperature $T_{actual}$ in the MR magnetic coil system is measured and compared with the first temperature target value $T1_{target}$.

c2: When $T_{actual} < T1_{target}$, the first barrier valve is closed in the vacuum pump is switched off.

d1: The current temperature $T_{actual}$ in the MR magnetic coil system is measured and compared with the second temperature target value $T2_{target}$ at which the operating temperature of the MR magnetic coil system for MR analyses has been attained. The second temperature target value $T2_{target}$ is maintained.

e: Helium is fed into the neck tube and liquefied.

d2: In the event of failure of the cold head, liquid helium in the neck tube is pumped away by the vacuum pump in order to cool the MR magnetic coil system.

Figure 8:
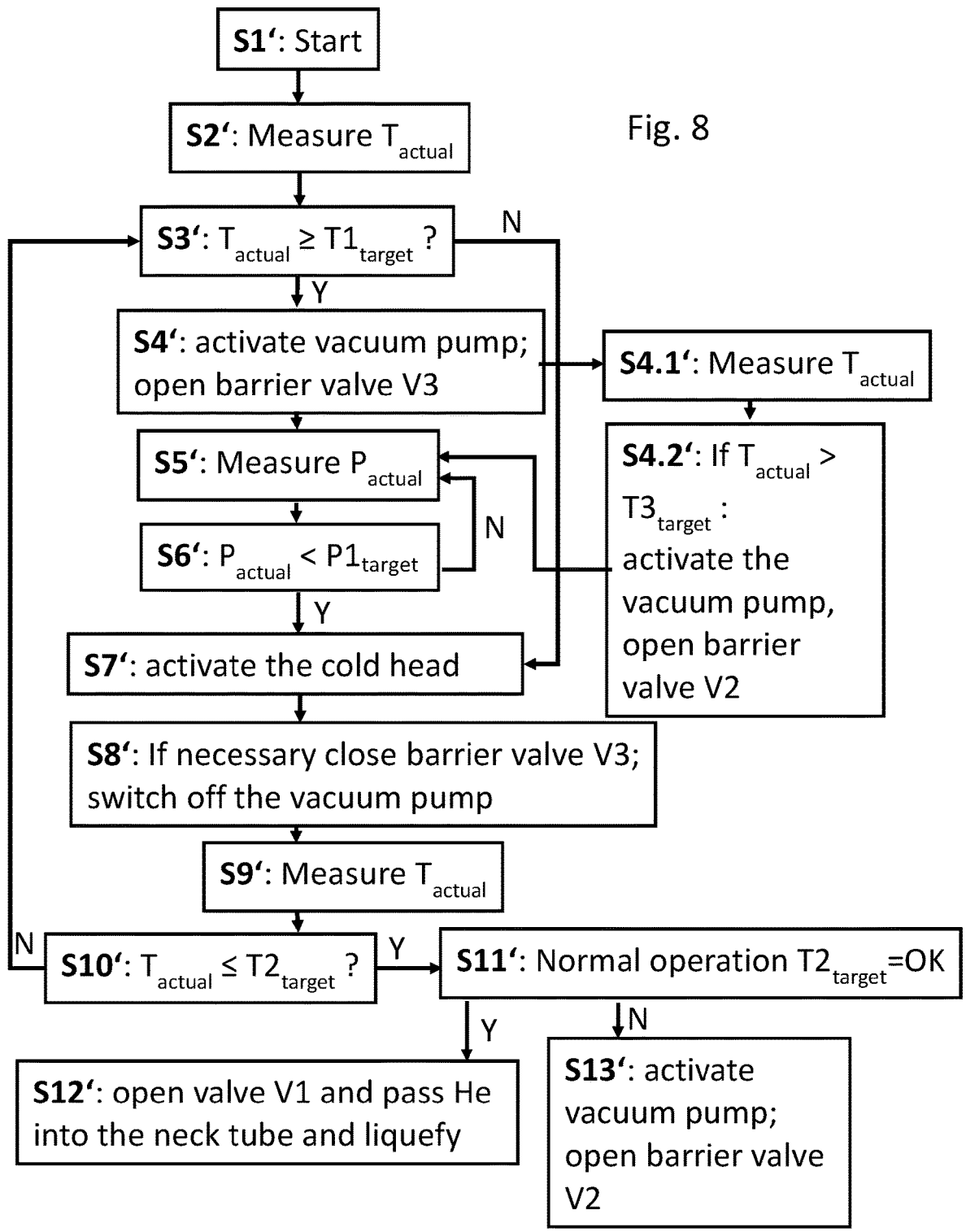
FIG. 8 a flow diagram of the basic sequence of the auto-cooling method of the invention in the form of an algorithm as is to proceed in a corresponding program in the control unit, specifically for embodiments with three valves as in FIG. 5.

The basic sequence of the cooling method of the invention in the form of an algorithm as is to proceed in a corresponding program in the control unit for embodiments having three valves is shown as a flow diagram in FIG. 8 and discussed further below.

The algorithm can be divided into the following steps:

S'1: The control unit is started.

S'2: The temperature sensor of the MR magnetic coil system which is connected to the measurement unit measures the current temperature $T_{actual}$.

S'3: The temperature $T_{actual}$ is compared in the processor unit with the value $T1_{target}$, and it is verified whether $T_{actual} \geq T1_{target}$. If the test is negative, the algorithm is continued at S7'. If the test is positive, the actuation unit activates the vacuum pump and opens the barrier valve V3.

S'4: The actuation unit activates the vacuum pump and opens the barrier valve V3.

S'4.1: The temperature sensor of the MR magnetic coil system which is connected to the measurement unit measures the current temperature $T_{actual}$.

S'4.2: The temperature $T_{actual}$ is compared in the processor unit with the value $T3_{target}$, and it is verified whether $T_{actual} > T3_{target}$. If the test is positive, the actuation unit activates the vacuum pump and opens the barrier valve V2.

S5': The pressure sensor for the vacuum vessel connected to the measurement unit measures the current pressure $P_{actual}$.

S6': The pressure $P_{actual}$ is compared in the processor unit with the value $P1_{target}$, and it is verified whether $P_{actual} < P1_{target}$. If the test is negative, the pressure $P_{actual}$ is measured again (and the algorithm is continued at S5'). If the test is positive, the actuation unit activates the cold head.

S7': The actuation unit activates the cold head.

S8': If necessary, the actuation unit closes the barrier valve V3 and the barrier valve V2 and deactivates the vacuum pump.

S9': The temperature sensor of the MR magnetic coil system which is connected to the measurement unit measures the current temperature $T_{actual}$.

S10': The temperature $T_{actual}$ is compared in the processor unit with the value $T2_{target}$, and it is verified whether $T_{actual} \leq T2_{target}$. If the test is negative, the algorithm is continued at S3'. If the test is positive, the algorithm is continued at S11'.

S11': The processor unit checks whether, in normal operation, $T2_{target}$=OK. If the test is positive, the algorithm is continued at S12'. If the test is negative, the algorithm is continued at S13'.

S12': The actuation unit opens valve V1, and gaseous helium is guided into the neck tube and liquefied.

S13': The actuation unit activates the vacuum pump and opens the barrier valve V2.

The invention claimed is:

1. A method of operating a magnetic resonance (MR) apparatus having a superconductive MR magnetic coil system which is disposed in a vacuum vessel and is cryogen-free in MR analysis operation, the apparatus having a cryostat for cooling the MR magnetic coil system which comprises a neck tube that leads through an outer shell of the vacuum vessel to the MR magnetic coil system, wherein a cooling arm of a cold head is disposed at least partly within the neck tube, and wherein a closed cavity which is formed around the cooling arm is sealed in a fluid-tight manner with respect to the MR magnetic coil system to be cooled and is at least partly filled with a cryogenic fluid during normal operation of the MR apparatus, wherein the method comprises:

(a1) measuring a current temperature $T_{actual}$ in the MR magnetic coil system and comparing $T_{actual}$ with a definable first temperature target value $T1_{target}$ at which the vacuum vessel is to be pumped out;

(a2) if $T_{actual} > T1_{target}$, activating a vacuum pump disposed outside the vacuum vessel and opening a first barrier valve in a vacuum conduit that leads from the vacuum pump into the vacuum vessel;

(b1) measuring a current pressure $P_{actual}$ in the vacuum vessel and comparing $P_{actual}$ with a definable first target pressure $P1_{target}$ at which the MR magnetic coil system is to be cooled down to cryogenic temperature;

(b2) if $P_{actual} < P1_{target}$, activating the cold head for cooling of the cooling arm;

(c1) measuring the current temperature $T_{actual}$ in the MR magnetic coil system and comparing $T_{actual}$ with the first temperature target value $T1_{target}$;

(c2) if $T_{actual} < T1_{target}$, closing the first barrier valve and switching off the vacuum pump; and (d1) measuring the current temperature $T_{actual}$ in the MR magnetic coil system and comparing $T_{actual}$ with a definable second temperature target value $T2_{target}$ at which the operating temperature of the MR magnetic coil system for MR measurements has been attained and maintaining $T_{actual}$ at the second temperature target value $T2_{target}$.

2. The method as claimed in claim 1, wherein the neck tube is connected via a first valve V1 to a helium feed, and wherein the method further comprises, in a step (e), feeding helium into the neck tube and liquifying said helium.

3. The method as claimed in claim 1, wherein a feed conduit to the neck tube is connected via a further valve V2 to the vacuum pump, and wherein the neck tube is pumped dry by the steps of:

(a3) measuring the current temperature $T_{actual}$ in the MR magnetic coil system and comparing $T_{actual}$ with a definable third temperature target value $T3_{target}$ from which the neck tube is to be pumped out; and (a4) if $T_{actual} > T3_{target}$, actuating the vacuum pump and opening the second barrier valve V2 in a vacuum conduit that leads from the vacuum pump to the neck tube.

4. The method as claimed in claim 3, wherein, in the event of a failure of the cold head, in a step (d2), the vacuum pump is used to pump away the liquid helium in the neck tube in order to cool the MR magnetic coil system.

5. The method as claimed in claim 1, wherein the definable temperature target values $T1_{target}$, $T2_{target}$ and $T3_{target}$ and the definable pressure target value $P1_{target}$ are selected from the following ranges of values:

$5K \leq T1_{target} \leq 20K$;
$3K \leq T2_{target} \leq 5K$;
$250K \leq T3_{target} \leq 300K$, and
$10^{-4}$ mbar $\leq P1_{target} \leq 10^{-3}$ mbar.

6. An MR apparatus for performing the method as claimed in claim 1, wherein the MR apparatus further comprises a temperature sensor for measuring a current temperature $T_{actual}$ in the MR magnetic coil system and a first pressure sensor for measuring a current pressure $P_{actual}$ that are present in the vacuum vessel, and wherein a control unit is configured to detect and compare the current temperature $T_{actual}$ in the MR magnetic coil system with defined temperature target values, to detect and compare the current pressure $P_{actual}$ in the vacuum vessel with defined pressure target values, and to actuate the first barrier valve, the vacuum pump and the cold head.

7. The MR apparatus as claimed in claim 6, wherein the vacuum pump has an at least 2-stage construction and has a turbomolecular pump and a backing pump therefor.

8. A control unit for use in an MR apparatus that performs the method as claimed in claim 1, wherein the control unit is configured to detect and compare a current temperature $T_{actual}$ in the MR magnetic coil system with defined temperature target values, and to detect and compare a current pressure $P_{actual}$ in the vacuum vessel with defined pressure target values, the control unit comprising:

a measurement unit in which a temperature sensor for measuring the current temperature $T_{actual}$ in the MR magnetic coil system and a pressure sensor for measuring the current pressure $P_{actual}$ in the vacuum vessel are connected;

an actuation unit for opening and closing the first barrier valve, for activating and deactivating the vacuum pump and for activating and deactivating the cold head, and a processor unit which is disposed as an interface between the measurement unit and the actuation unit for comparison of the sensor parameters detected with the target parameters and the processing of the data for actuation of the cold head, vacuum pump and barrier valve.

9. The control unit as claimed in claim 8, further comprising a second pressure sensor for measuring the current pressure $P_{HR}$ in the cavity surrounding the cooling arm of the cold head that is connected to the measurement unit, wherein the actuation unit is configured to open and close the second and third barrier valves.

10. The control unit as claimed in claim 9, further comprising a connection from the neck tube to the vacuum pump, wherein the control unit implements control of V2 to the vacuum pump.

11. The control unit as claimed in claim 9, further comprising a connection from a helium feed to the neck tube, wherein the control unit implements control of the He feed via the valve V1.

* * * * *